United States Patent
Giovannone et al.

(10) Patent No.: US 9,401,799 B2
(45) Date of Patent: Jul. 26, 2016

(54) SYNCHRONIZATION METHOD, AND CORRESPONDING DEVICE AND INTEGRATED CIRCUIT

(71) Applicant: STMicroelectronics S.r.l., Agrate Brianza (IT)

(72) Inventors: Juri Giovannone, Cemobbio (IT); Valeria Bottarel, Novara (IT); Marco Terenzi, San Martino Siccomario (IT); Sandro Rossi, Pavia (IT)

(73) Assignee: STMICROELECTRONICS S.R.L., Agrate Brianza (IT)

(*) Notice: Subject to any disclaimer, the term of this patent is extended or adjusted under 35 U.S.C. 154(b) by 0 days.

(21) Appl. No.: 14/661,937

(22) Filed: Mar. 18, 2015

(65) Prior Publication Data

US 2016/0036583 A1    Feb. 4, 2016

(30) Foreign Application Priority Data

Aug. 4, 2014   (IT) .............................. TO2014A0625

(51) Int. Cl.
| | |
|---|---|
| *H04L 7/00* | (2006.01) |
| *H03K 5/135* | (2006.01) |
| *H03K 5/14* | (2014.01) |
| *H03L 7/081* | (2006.01) |

(52) U.S. Cl.
CPC .............. *H04L 7/0045* (2013.01); *H03K 5/135* (2013.01); *H03K 5/14* (2013.01); *H03L 7/0814* (2013.01); *H04L 7/0037* (2013.01)

(58) Field of Classification Search
CPC . H04L 7/0045; H04L 7/0037; H04W 56/004; H04W 56/0055
See application file for complete search history.

(56) References Cited

U.S. PATENT DOCUMENTS

| | | | |
|---|---|---|---|
| 5,359,586 A * | 10/1994 | Izumi ............... | G11B 11/10515 369/110.01 |
| 5,900,762 A | 5/1999 | Ramakrishnan | |
| 6,115,769 A * | 9/2000 | Anderson ........... | H03K 3/0315 327/262 |
| 8,237,475 B1 | 8/2012 | Nagarajan et al. | |
| 2003/0001634 A1 | 1/2003 | Cao et al. | |
| 2005/0110544 A1 * | 5/2005 | Suda ................ | G01R 31/31922 327/165 |
| 2007/0115035 A1 | 5/2007 | Hinz et al. | |

FOREIGN PATENT DOCUMENTS

WO   99/07070 A1   2/1999

* cited by examiner

*Primary Examiner* — Jean B Corrielus
(74) *Attorney, Agent, or Firm* — Seed IP Law Group PLLC (57) ABSTRACT

The operation of a circuit exhibiting a delay that is subject to a time spread as a function of process, voltage, and temperature variations is synchronized with a synchronization signal. A digital delay corresponding to the time spread is applied to the synchronization signal. The digital delay is generated via cascaded delay elements having respective delay values and by controlling the number of cascaded delay elements in the circuit that are applied to the synchronization signal.

16 Claims, 8 Drawing Sheets

FIG. 10

SYNCHRONIZATION METHOD, AND CORRESPONDING DEVICE AND INTEGRATED CIRCUIT

BACKGROUND

1. Technical Field

The present disclosure relates to synchronization techniques.

One or more embodiments may find application in integrated circuits.

2. Description of the Related Art

In the sector of integrated circuits (ICs) the requirement of supplying signals at high frequency synchronized in an accurate way is increasingly felt.

With the continuous rise in clock frequencies, it becomes ever more problematical to maintain accurately the characteristics of a timing signal at a given frequency with respect to any possible skew linked to process, voltage, and temperature (PVT) variations. The behavior in regard to process, voltage, and temperature may vary from one device to the next, with certain tolerances, and these variations may change the value of the delay. These factors can also induce negative effects in terms of jitter.

High-speed synchronous integrated circuits, such as, for example, microprocessors and memories, can function accurately in the presence of clock signals aligned in a precise way. With the continuous rise in clock frequencies and in the number of components (e.g., transistors) there is felt to an increasingly stringent extent the need to provide synchronization systems that are able to reduce and, at least virtually, eliminate any possible skew and undesirable jitter phenomena linked to the aforesaid process, voltage, and temperature (PVT) variations.

If reference is made to high-voltage (HV) devices, there is felt to an increasing extent the need to provide high-frequency signals synchronized in an accurate way, the purpose of this being, for example, to reduce power absorption and improve performance of the systems that use such circuits, for instance, DC/DC converters, electromedical devices, etc. In particular, with the continuous increase of resolution in high-voltage synchronization systems, the time error produced by the integrated circuits may contribute significantly to the overall time error.

Application of solutions of this nature to contexts in which higher voltage signals are present comes up against critical aspects of various nature. For instance, in printed-circuit boards (PCBs) on which high-voltage signals are present it is possible to find high levels of crosstalk, which are particularly critical in the case where an integrated component operating in this context is arranged to perform functions timed, for example, with reference to pulsed signals, for instance, pulsed signals with variable duty cycle such as PWM signals.

The picture appears even more critical in the case where a number of high-voltage signals are present of which it is desired to achieve a high level of mutual synchronization.

Aspects of this nature have already been tackled by resorting to open-loop or closed-loop synchronization topologies that are able to operate, for example, in a CMOS technology context.

For instance, various implementations can operate with phase-locked loops (PLLs) or with (digital) delay-locked loops (DLLs), which are suited to being calibrated in regard to the PVT factors. There are, however, possible disadvantages in terms of consumption and, in addition or in the alternative, occupation of circuit area and limitations to just the variations of phase of the clock signal.

In particular, in addition to having a limited band, these locked loops can supply a signal having a resolution directly proportional to the input frequency. A variable clock frequency can lead to long delay steps when the frequency is low. Any technological limitation in terms of speed may be such as to limit the upper frequency that can be used.

BRIEF SUMMARY

The object of one or more embodiments is to overcome the limitations outlined previously.

According to one or more embodiments, the above object is achieved thanks to a synchronization method having the characteristics recalled specifically in the ensuing claims.

One or more embodiments may refer also to a corresponding synchronization device and to an integrated circuit comprising such a synchronization device.

The claims form an integral part of the technical teaching provided herein in relation to the embodiments.

One or more embodiments may be applied to timing of integrated circuits (ICs).

One or more embodiments may enable control of a delay along a signal path within a PVT self-calibration circuit.

One or more embodiments make it possible to provide a programmable delay circuit that is easy to calibrate and is able to adjust the delay in small time increments.

In one or more embodiments, one such circuit can be used over a wide range of clock frequencies.

One or more embodiments enable adoption of a modular approach, which will be able to reduce the area occupation and consumption levels.

One or more embodiments make it possible to achieve high performance, constituting an improvement in particular in relation to the spread of the technological process parameters.

One or more embodiments propose a closed-loop synchronization scheme that may be applied, for example, to high-voltage signals.

One or more embodiments can accept a high input jitter achieving a low jitter of the output signal (for example, with respect to the synchronization or sync signal), independent of the frequency.

One or more embodiments may present one or more of the following advantages:

- possibility of using a single sync signal for a number of channels (from low voltage to high voltage) with different input signals;
- possibility of providing a delay adjustment with a high granularity (exploiting the smallest delay step allowed by the technology used);
- possibility of using a timing signal as external sync signal with a wide range of possible frequencies and a fixed time shift;
- reduction of the skew with respect to the timing signal;
- increased immunity in regard to crosstalk, even if high, at the level of PCB, also in a high-voltage environment and with signals with steep edges;
- possibility of implementing an action of pulse modulation, for example, PWM, indifferently on the rising edges or falling edges of the clock signal; and
- resolution altogether independent of the frequency of the control signal, in so far as it is linked to the technology adopted.

BRIEF DESCRIPTION OF THE SEVERAL VIEWS OF THE FIGURES

Non-limiting and non-exhaustive embodiments are described with reference to the following drawings, wherein like labels refer to like parts throughout the various views unless otherwise specified. One or more embodiments will now be described, purely by way of non-limiting example, with reference to the annexed figures, wherein.

DETAILED DESCRIPTION

In the ensuing description, various specific details are illustrated aimed at providing an in-depth understanding of examples of one or more embodiments. The embodiments may be provided without one or more of the specific details, or with other methods, components, materials, etc. In other cases, known structures, materials, or operations are not shown or described in detail so that various aspects of the embodiments will not be obscured. Reference to "an embodiment" or "one embodiment" in the framework of the present description is meant to indicate that a particular configuration, structure, or characteristic described in relation to the embodiment is comprised in at least one embodiment. Hence, phrases such as "in an embodiment" or "in one embodiment" that may be present in various points of this description do not necessarily refer to one and the same embodiment. Furthermore, particular conformations, structures, or characteristics may be combined in any adequate way in one or more embodiments.

The references used herein are only provided for convenience and hence do not define the sphere of protection or the scope of the embodiments.

Possible contexts of application of one or more embodiments are, for example, integrated devices for envelope-tracking of base stations of mobile communication systems (for example, in a base transceiver station—BTS—of a 4G or 5G network), ultrasound display or imaging, digital video transmission, active antennas, and, in general, high-voltage circuits in which it is advantageous to handle signals with high temporal precision.

One or more embodiments may be applied, for example, to "high voltage" integrated circuits, which are able to operate with signals of the order of tens of volts or higher, as opposed to "low voltage" operating levels, with signals of the order of volts, such as those that may be encountered, for example, in CMOS logics.

One or more embodiments as exemplified herein may find application in integrated circuits in which it is desirable for a clock signal CLK_chip to have a fixed time shift TS with respect to a pulsed sync signal having positive and negative edges. In what follows, reference will be made—by way of non-limiting example—to a signal with variable duty cycle such as a pulse-width-modulated signal PWM generated starting from a signal CLK_fpga.

The aforesaid time shift is nominally fixed, but may be subject to jitter, for example, following upon the variations linked to the PVT factors mentioned at the start of the present description. For instance, an integrated circuit may comprise a number of modules subject to different jitters. One or more embodiments may operate in such a way that, in each of these modules, the signal CLK_chip presents a fixed time shift TS with respect to the input pulsed signal.

Figure 1:
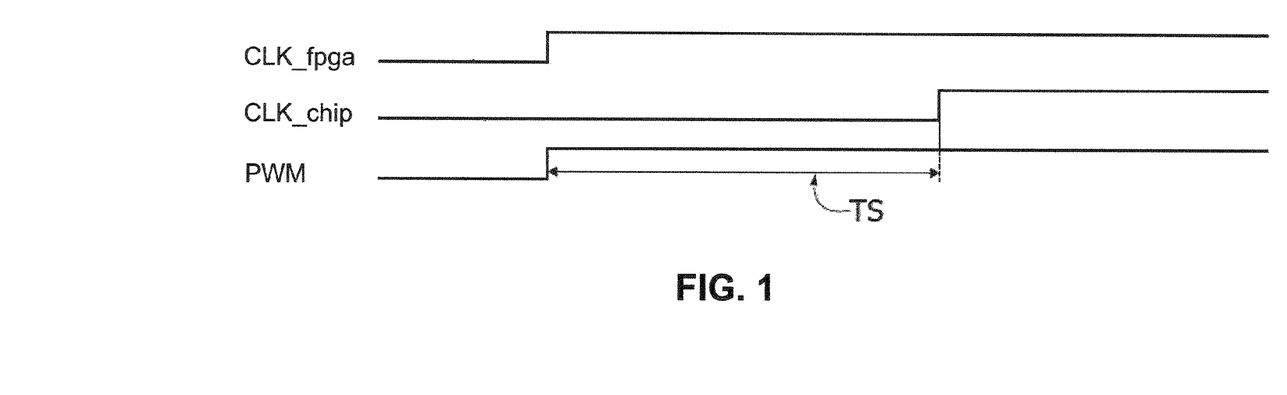
FIGS. 1, 2, and 3 are various chronograms representing signals that may be present in one or more embodiments.
Figure 2:
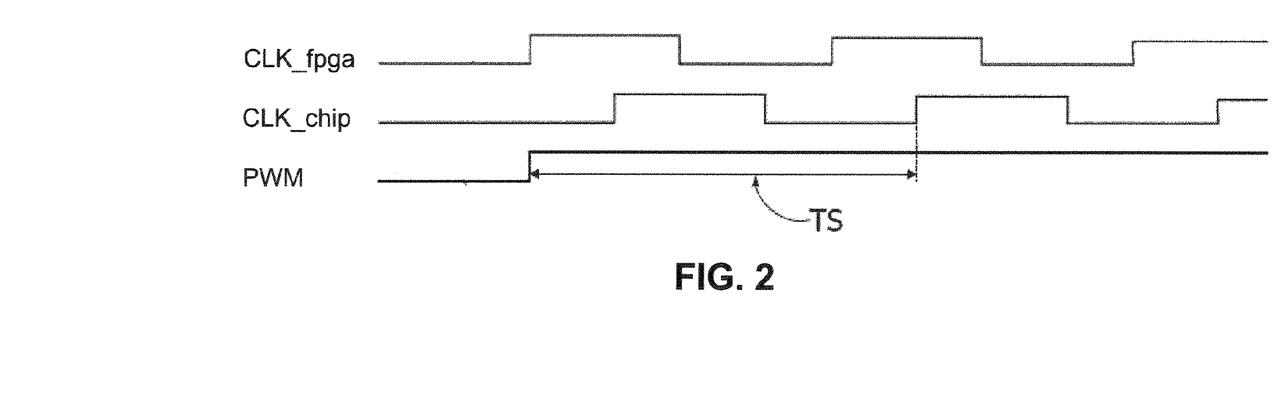

FIGS. 1 and 2 exemplify possible plots of signals CLK_fpga, CLK_chip, and PWM in the case of input signals with a low-frequency clock (FIG. 1) and in the case of input signals with a high-frequency clock (FIG. 2). The input signals PWM may be generated both by a positive edge of the clock as shown in the figures and by a negative edge of the signal CLK_fpga.

Figure 3:
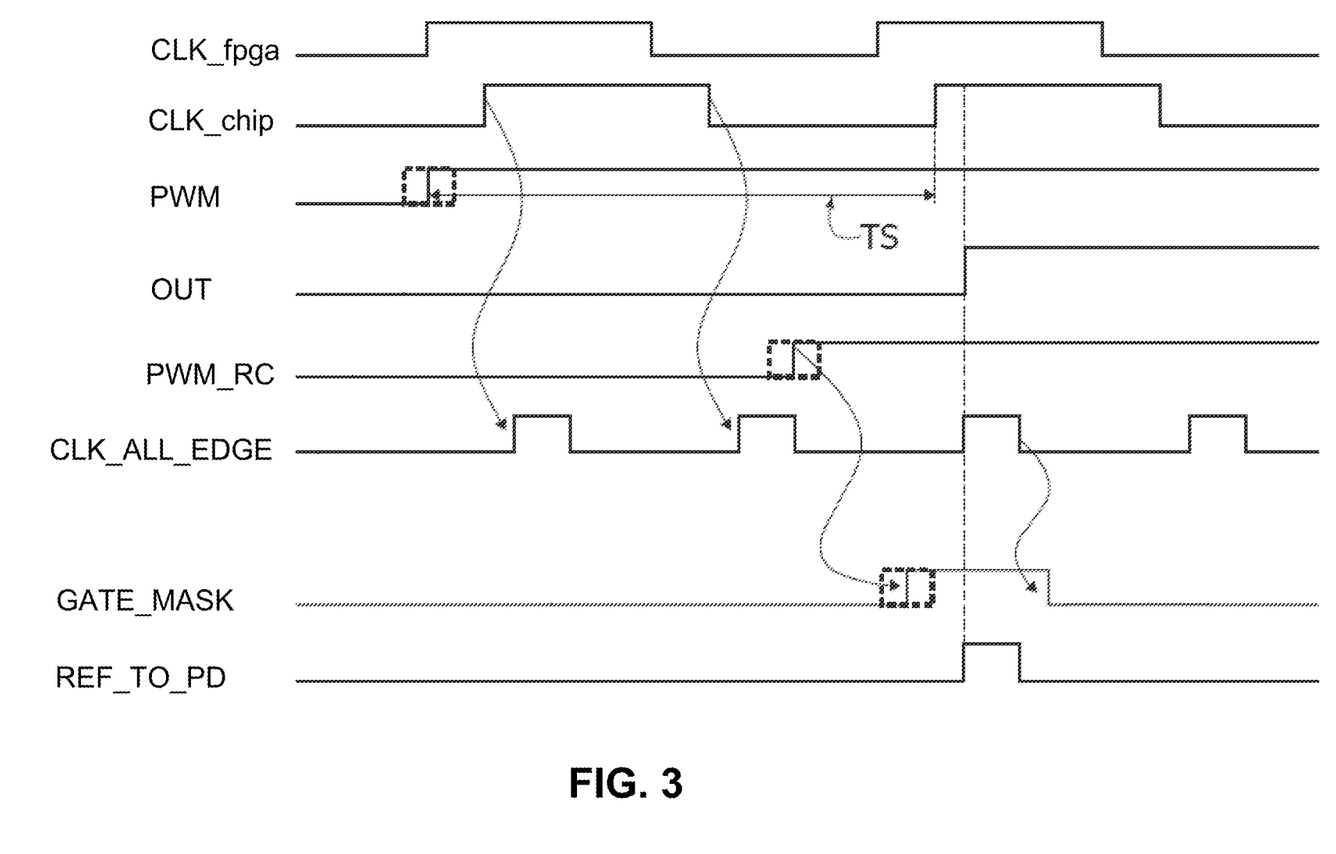

FIG. 3 presents, by way of example of the operating principle of one or more embodiments, plots of some internal signals in addition to the signals CLK_fpga, CLK_chip, and PWM already introduced previously.

Figure 4:
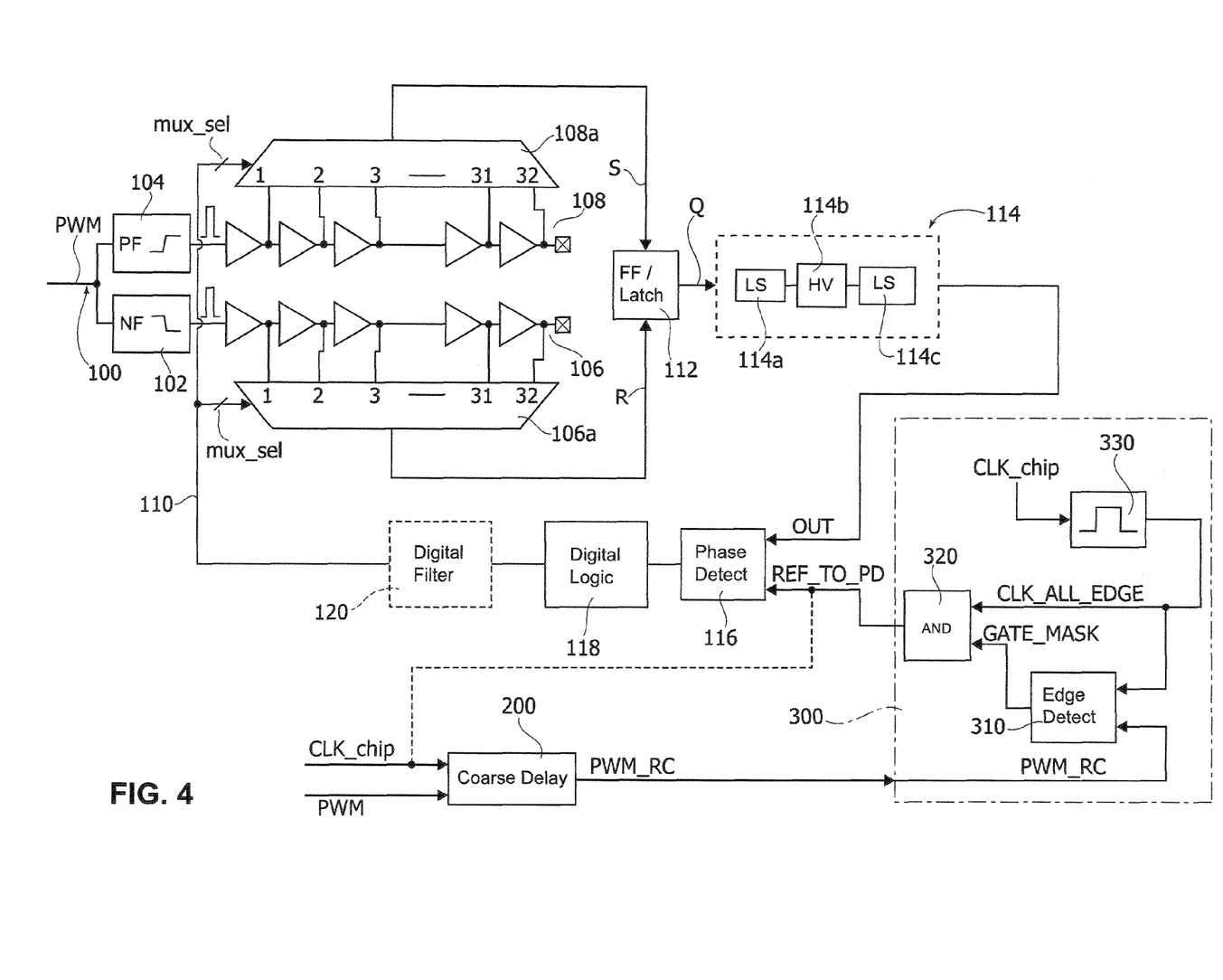
FIG. 4 is a block diagram exemplifying embodiments.

In particular, FIG. 3 represents a signal OUT that may be present at output from the block 114 represented in the diagram of FIG. 4 described in what follows. For instance, in one or more embodiments, the signal OUT may be the output of a high-to-low (H-to-L) level shifter 114c arranged to shift downwards the signal present at output from a high-voltage block 114b.

The signal OUT may be viewed as the signal that, in one or more embodiments, is to be synchronized with the edge of the clock, hence synchronized in a correct way, but for a delay produced by traversal of the blocks 330 and 320 described in what follows, with the spread due to the PVT factors of this delay that may prove negligible with respect to the top calibration resolution that can be achieved by the system: for this reason, it is possible not to take into account such a delay.

FIG. 3 moreover exemplifies the possible plot of other signals considered in greater detail in what follows (in particular, with reference to FIGS. 8, 9, and 10), i.e., a signal PWM_RC exemplifying a modified (delayed) signal PWM and a signal CLK_ALL_EDGE that can be generated, in one or more embodiments, by an edge detector that is able to detect the edges of the input clock (whether positive or negative edges).

In one or more embodiments, the output signal of the block 114 represented in the diagram of FIG. 4, appropriately masked with a signal GATE_MASK, makes it possible to produce a pulsed signal REF_TO_PD that can be used as synchronizer (see the coincidence thereof with the rising edge of the signal OUT).

As will be seen more clearly in what follows (for example, with reference to FIG. 9), the masking signal GATE_MASK can be generated by a dedicated circuit that uses a calibrated RC filter.

The purpose of the above is to prevent the circuits described from being affected by the perturbations induced by variations linked to the PVT factors, so that they can operate with a constant value of time shift TS, by varying the frequency of the clock CLK, with a clock period CP that will be assumed nominally identical in the case of both of the signals CLK_fpga and CLK_chip.

The dashed rectangles appearing in the chronograms of FIG. 3 for the signals PWM, PWM_RC, and GATE_MASK represent the possible time variation of the edges of these signals that may be induced by the PVT and jitter factors, thereby highlighting the fact that one or more embodiments make it possible to counter and, at least virtually, eliminate the influence of these variations on the precision of synchronization.

In one or more embodiments, the pulses of the signal OUT may present, with respect to the rising edges (or falling edges: this aspect may be indifferent in one or more embodiments) of the input signal PWM a (nominally) fixed chip propagation delay (CPD).

The block diagram of FIG. 4 exemplifies a possible architecture according to one or more embodiments.

In the diagram of FIG. 4 the reference number 100 designates an input terminal to which there can be applied a pulsed input signal, for example, a pulsed signal with variable duty cycle.

For simplicity of illustration, and consistently with what has been already exemplified previously, the above signal will be assumed as a pulse-width modulated signal, designated by the reference PWM.

In one or more embodiments, it may be assumed that the pulsed signal PWM is a signal the pulse width of which ($t_1$-$t_0$), i.e., the distance in time between the rising edges (which here will be assumed as occurring at instant $t_0$) and the falling edges (which here will be assumed as occurring at instant $t_1$) is given and selectively controllable.

The references 102 and 104 designate two modules/functions that, operating in a way in itself known, are able to detect the rising and falling edges of the input signal PWM and to generate corresponding pulsed signals.

In one or more embodiments as exemplified herein, it may be assumed that:
  the module/function 102 functions as detector of the negative edges (hence of the falling edges) so as to generate a first pulsed signal comprising pulses the temporal position of which corresponds to the temporal position of the falling edges of the input signal PWM; and
  the module/function 104 functions, instead, as detector of the positive edges (hence of the rising edges) so as to generate a second pulsed signal comprising pulses the temporal position of which corresponds to the temporal position of the rising edges of the input signal PWM.

The references 106 and 108 designate two chains of delay elements (provided according to any technology known for this purpose, for example in the form of buffers) comprising a certain number N of delay elements (which may be variable according to the embodiment), which are able to apply corresponding increasing values of delay to the pulsed signals generated by the modules/functions 102 and 104. In one or more embodiments, N may be equal to 32; of course, this value is indicated purely by way of non-limiting example.

To the chains of delay elements 106 and 108 there may be associated respective output multiplexers 106a and 108a driven by a signal mux_sel present on a line 110 (which will be described more fully in what follows) the value of which identifies one of the output tapping points, or output taps, of the delay chains 106 and 108 and, consequently, the delay value applied to the pulsed signals at output from the module/function 102 and from the module/function 104, respectively.

The solution here exemplified hence makes it possible to provide a digital delay with a programmable delay value that can be used for compensating, for example within one and the same integrated circuit comprising the various elements represented in FIG. 4, the "analog" delay that is subject to variations resulting from the PVT factors.

The components 106, 106a, and 108, 108a implement a programmable delay circuit constituted by a chain of delays and a multiplexer. In one or more embodiments, the delay lines 106 and 108 may comprise a series of buffer stages (or generic unit delays, represented as triangles in the figures) cascaded together. The output of each delay stage, in addition to being connected to the next stage, constitutes a tap, i.e., an intermediate output that reproduces the input signal with a given delay that is unique for that particular tap. The taps of the delay line are connected to the inputs of the multiplexer, which selects a single tap on the basis of the value of the signal mux_sel. The output of the multiplexer is the output of the programmable delay circuit. The corresponding output signal is hence the input signal with a delay that is a function of the value of the signal mux_sel.

As will be seen more clearly in what follows, the value of this signal mux_sel (and hence the value of the delay introduced in the signal) may be given by a phase-detector circuit 116, which, for example, detects the "phase", i.e., the time offset between the signal at output from an analog block 114 and the signal of the clock CLK_chip, which may be in the form of the signal REF_TO_PD deriving from conditioning implemented in the block 300, which will be described in what follows.

In one or more embodiments, the delay elements of the lines of 106 and 108 may be elements with a fixed delay value (for example, 200 picoseconds—this value being provided by way of non-limiting example), which may be chosen for example, at the lowest value allowed by the manufacturing technology. In this way, the value of overall delay can be determined by choosing the number of the aforesaid elements that are to be traversed by the signal subject to delay. In so doing both the overall value of the above delay and the granularity thereof can be rendered independent of the operating frequency (for example, the frequency of the control signal).

The reference 112 designates a flip-flop (or latch), for example of a Q type, the set and reset inputs of which are driven by the output of the multiplexer 106a (reset input R) and by the output of the multiplexer 108a (set input S).

Persons skilled in the sector will appreciate that the configuration of connection presented herein is provided purely by way of example: in one or more embodiments, the modes of connection of the delay circuits 106, 106a and 108, 108a could be reversed both as regards the connection to the modules/functions 102, 104 and as regards the connection to the set and reset inputs of the flip-flop 112, preserving an operation similar to the one described herein by acting in a complementary way on the various modalities of connection.

This applies also, but not exclusively, to the "doubled" nature of the delay circuit that comprises the two lines 106, 108 and the multiplexers 106a and 108a that supply their output signals to the flip-flop or latch 112.

To delay the pulsed output signals of the detectors 102 and 104, one or more embodiments may use just one delay circuit (just one cascade of delay stages and just one multiplexer) with the output of the multiplexer supplied to the analog block 114 which will be described more fully in what follows.

Use, in one or more embodiments, of a "doubled" delay circuit (two lines 106, 108 and two multiplexers 106a and 108a) makes it possible to render independent the actions of delay on the pulsed signals at output from the detector 102 and from the detector 104. It is thus possible to render independent the actions of delay on the rising edges and on the falling edges of the pulsed input signal (PWM, in the example here considered).

The output signal of the delay circuit (i.e., in the example here considered, the output Q of the flip-flop or latch 112) is supplied to an analog block 114.

For the purposes of the present description, within an integrated circuit corresponding to the diagram of FIG. 4, the block 114 may be viewed as exemplifying the fact that—for example, as a result of the variations linked to the PVT factors already mentioned more than once herein—the aforesaid signal may undergo a variable "analog" delay (see for example, AD1, AD2, or AD3 in FIG. 5 described in what follows) with a time spread that it is desired to compensate with an action of calibration carried out via the circuit exemplified in FIG. 4 by the elements 102 to 112 and by the elements associated thereto (such as, for example, the modules/functions 116, 118 and 120 described in what follows).

Once again (purely) for the purposes of description of FIG. 4, and with reference—purely by way of non-limiting example—to integrated circuits that are able to operate at high voltage, the analog block 114 may be viewed as one such as to comprise:

- a low-to-high (L-to-H) voltage-level shifter 114a such as to shift from a low voltage level LV to a high voltage level HV (in modulus or amplitude) the signal at output from the flip-flop 112;
- any high-voltage (HV) electronic circuit 114b exhibiting the effects of the PVT factors (for example, an inverter chain sized for driving a certain load);
- a high-to-low (H-to-L) voltage-level shifter 114c with the function of (re-) shifting to the low value, i.e., from a high voltage level HV to a low voltage level LV, a signal OUT at output from the block 114 for closing the loop.

It is recalled that this example is provided for the sole purposes of description of FIG. 4. In one or more embodiments operating at a low voltage (LV), the function of (L-to-H and H-to-L) level shifting here exemplified by the shifters 114a and 114c may in effect be absent, so that the signal OUT may be constituted simply by the signal at output from the electronic circuit 114b, which in this case is a low-voltage (LV) circuit.

In one or more embodiments, the signal OUT at output from the block 114 can be supplied to a phase detector 116, which, via a digital logic 118 and, optionally, a digital filter 120, can supply to the line 110 the signal mux_sel arranged to determine (via the multiplexers 106a and 108a) the delay value of the delay circuits 106 and 108 described previously.

In one or more embodiments, the phase detector 116 (and, if so required, the modules/functions driven thereby) may be doubled to form two sub-modules so as to reflect doubling of the delay circuit (two lines 106 and 108 and two multiplexers 106a and 108a). In what follows, in order not to unnecessarily burden the exposition, reference will be made to a single phase detector 116.

In one or more embodiments, the phase detector 116 can detect the phase (i.e., the time offset) between the signal OUT coming from the analog block 114 and the clock CLK_chip (appropriately conditioned, in some cases, as described in what follows so as to give rise to the reference signal REF_TO_PD): in the case of a circuit comprising a number of channels, these may have the signal CLK_chip in common.

Figure 5:
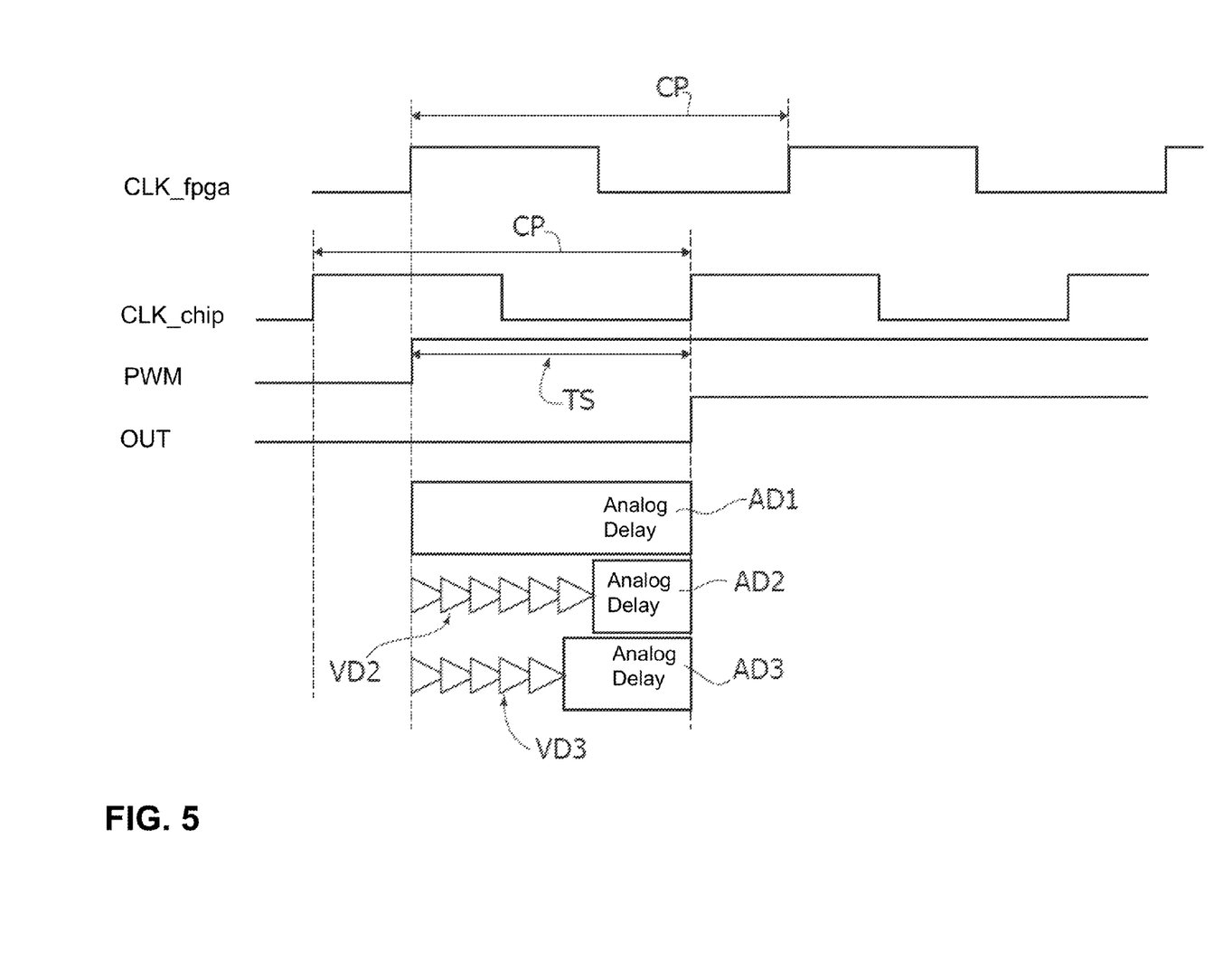
FIGS. 5, 6, and 7 are further chronograms representing signals that may be present in one or more embodiments.

The circuit of FIG. 4 constitutes an example of possible implementation of the principle exemplified in FIG. 5, i.e., that of keeping fixed in a precise way at a desired value the time shift TS between the input signal PWM and the output signal OUT by combining to the "analog" delay induced by the variations due to the PVT factors (which may present a time spread, i.e., have different values: see, for example, AD2 and AD3 in FIG. 5) a digital delay VD rendered selectively variable (for example, with the capacity of assuming different values such as VD2 or VD3).

This is done in such a way that the sum AD1 of the two delays (AD plus VD) will give rise to a time shift TS between the input signal PWM and the output signal OUT having a "calibrated" value corresponding to the desired fixed value.

In one or more embodiments, the digital delay VD can be rendered variable as a function of the number of delay elements of the delay chains 106, 108, for example (see FIG. 5) with 6 (six) delay elements or else 5 (five) delay elements according to whether the "analog" delay affected by the PVT factors is more or less long, for example, equal to AD2 or to AD3.

This can be done counting on the fact, already mentioned previously, that, in one or more embodiments, the individual delay elements or stages of the delay lines 106 and 108 may be elements with a certain delay value, which may be chosen, for example, at the lowest value allowed by the manufacturing technology, so that the overall value of digital delay (for example, VD2, VD3, . . . ) can be determined by choosing the number of the aforesaid elements that are to be traversed by the signal subject to delay. In so doing, both the overall value of the digital delay and the granularity with which this digital delay can be varied are rendered altogether independent of the operating frequency (for example, of the frequency of the control signal).

In this regard, it is recalled that, for the purposes of the present description, it is here assumed that the signal CLK_fpga is by definition synchronized with the pulsed input signal (for example, PWM).

As regards the corresponding output signal OUT, this is generated according to the criteria already described previously and in conditions where the inputs of the phase detector 116 for the synchronization loop are on the rising edge, while there exists the possibility of providing a synchronization on the negative (of falling) edge. As has already been said, it is here assumed that the signal here designated by PWM is by definition synchronized with the signal CLK_fpga, this also in the case where it is a signal not of the pulse-width-modulated type.

In the figures, the value of the time shift TS (here assumed as a fixed, non-modifiable, reference datum) is exemplified as being associated to the time shift between the input signal PWM and the signal CLK_chip.

One or more embodiments may, for example, envisage modification of the time offset between a sync signal deriving from the signal CLK_chip (REF_TO_PD) and the output: this action of modification can serve precisely to obtain the output OUT aligned to the clock. In this regard, it will be appreciated that FIGS. 6 and 7, to which further reference will be made in what follows, are to be read with reference to a fixed value of time shift TS and to a varied clock signal.

In one or more embodiments, it is possible to choose a time shift TS comprised between AD Max and AD Min+VD Max. In so doing, the value of digital delay may be determined by choosing the number of the delay elements of the lines 106 and 108 that are to be traversed by the signal subject to delay, with the overall value of the digital delay and the granularity with which this digital delay can be varied that are rendered altogether independent of the operating frequency.

One or more embodiments consequently enable synchronization with the sync signal PWM operation of the (integrated) circuit illustrated in FIG. 4. This circuit, as exemplified by the block 114, may exhibit an "analog" delay (for example, AD2, AD3) subject to time spread as a function of the variations induced by the PVT factors. One or more embodiments may envisage application to the sync signal PWM of a digital delay (for example, VD2, VD3) that can add to the "analog" delay.

In one or more embodiments, the digital delay may be produced via at least one set of cascaded delay elements (for example, lines 106 and 108) having respective delay values. The digital delay may be controlled by acting (for example, via the multiplexer 106a, 108a controlled by the signal mux_sel) on the number of cascaded delay elements comprised in the aforesaid at least one set (i.e., in the lines 106, 108).

As exemplified with a dashed line in FIG. 4, one or more embodiments may envisage detection (for instance, via the phase detector 116) of the time offset between the signal OUT coming from the output of the block 114, which may exhibit the delay subject to time spread as a function of the PVT factors, and the signal CLK_chip, which functions as reference timing signal.

The digital delay may be controlled by acting (with the signal mux_sel that controls the multiplexers 106a, 108a) on the number of cascaded delay elements comprised in the delay lines 106, 108 as a function of the time offset detected by the detector 116. In one or more embodiments, this may be done by obtaining the desired or target time shift, i.e., TS (fixed reference datum), between the sync signal PWM and the signal CLK_chip.

Figure 6:
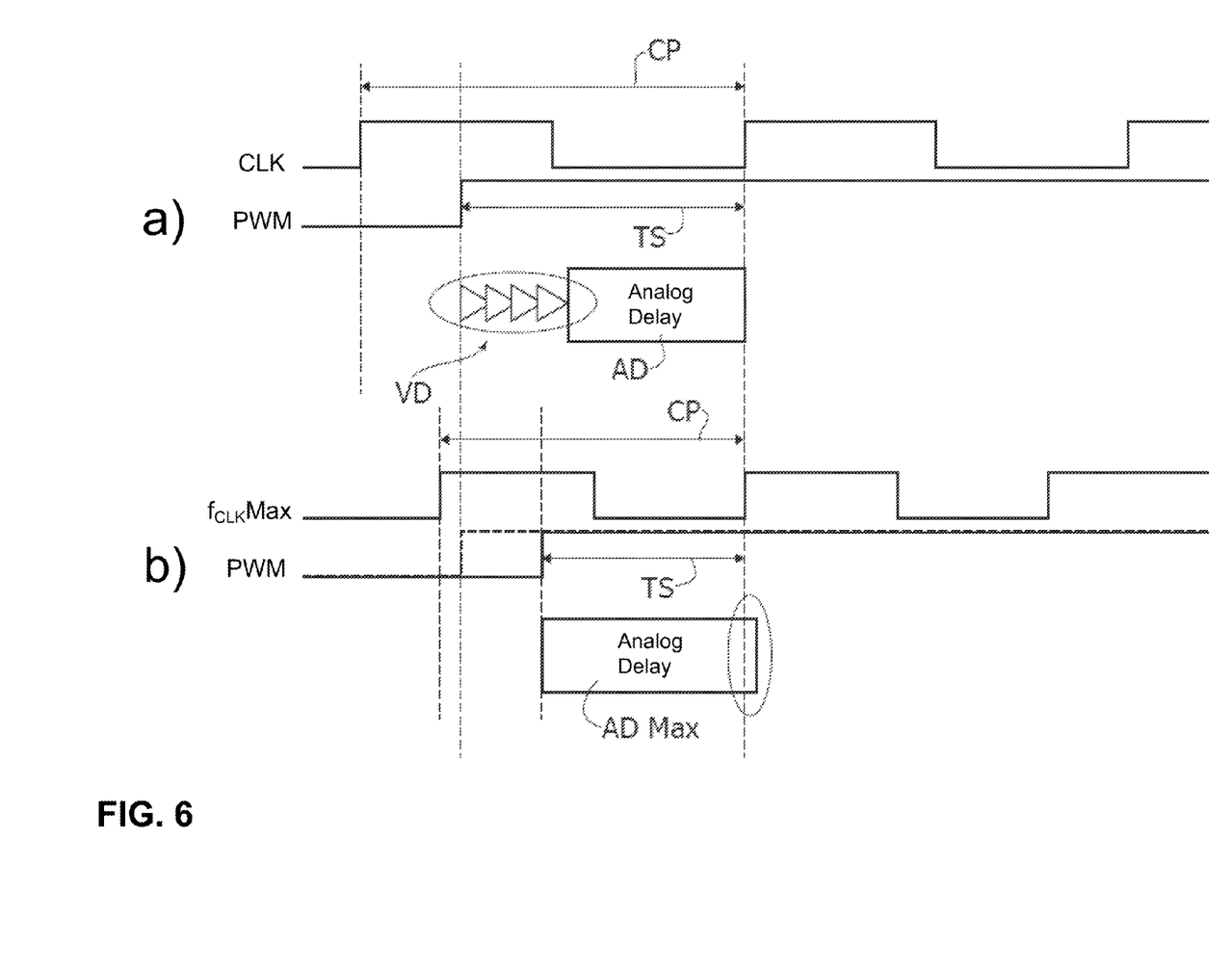
Figure 7:
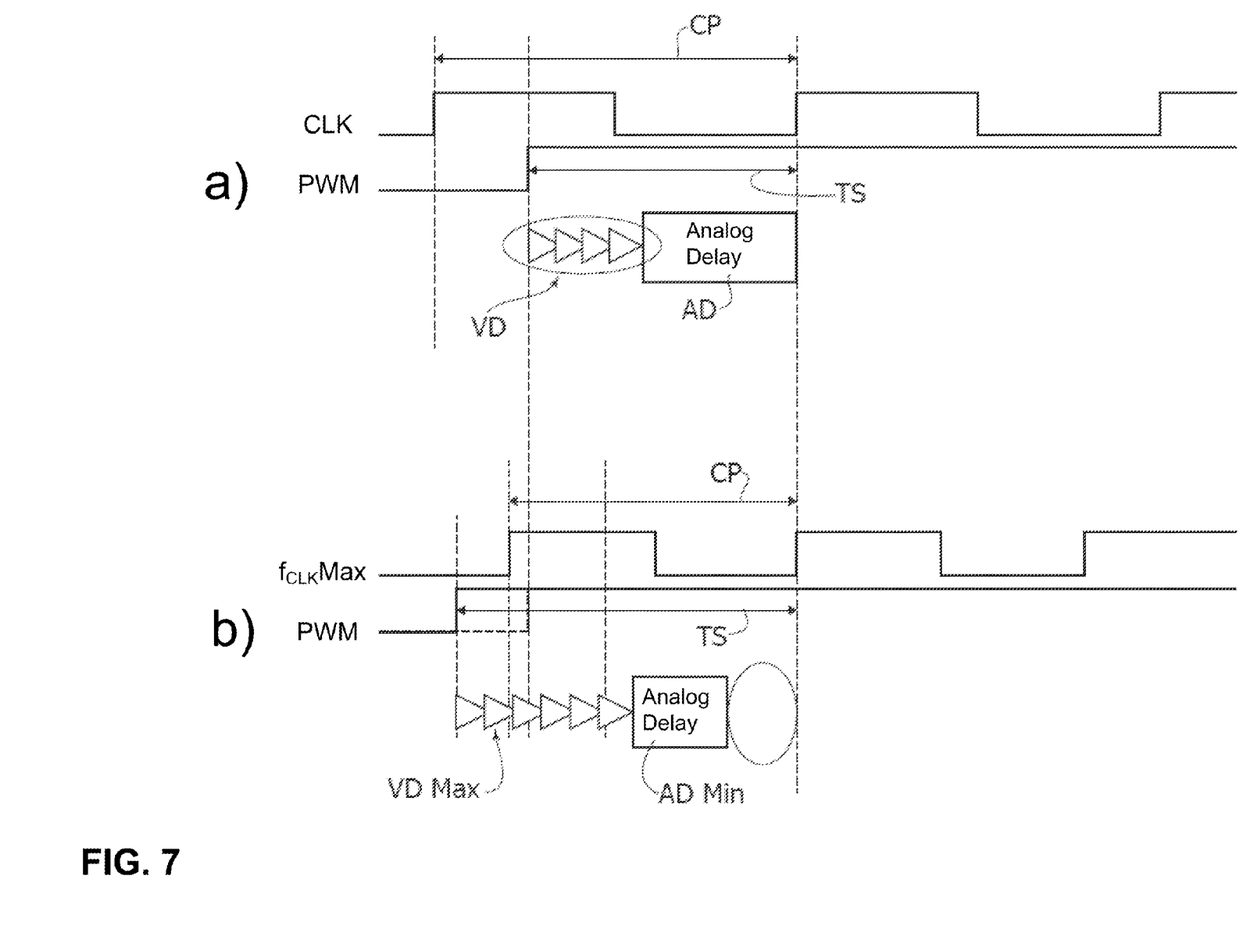

In one or more embodiments, the signal CLK_chip may be processed by the block 300 as described in what follows to give rise to a signal REF_TO_PD that may be supplied to the phase detector 116 for taking into account the possible onset of situations such as those represented in FIGS. 6 and 7.

FIGS. 6 and 7 (which, it is recalled, are to be read as referring to a fixed value of TS and to a varied clock signal) exemplify some particular conditions (for example, conditions of particularly high or low speed of operation of the circuit) where the analog delay AD—see the top part of FIGS. 6 and 7, designated by a)—could assume values such as not to allow the desired synchronization to be achieved.

For instance, in the situation exemplified in the bottom part of FIG. 6, designated by b), synchronization on a desired fixed value TS may not be possible in so far as it would require subtraction—and not addition—of a digital delay like the one that can be generated with the lines 106 and 108 from a value of analog delay AD Max, which is in itself already high so that the resulting signal in any case arrives too "late" with respect to the synchronization edge.

Once again by way of example, in the situation exemplified in the bottom part of FIG. 7, designated by b), synchronization on a desired fixed value TS may not be possible in so far as, albeit using all the delay elements of the lines 106, 108 for adding a digital delay to the analog delay AD, the latter has a value ADmin so low as to cause the signal to arrive in any case too "early" with respect to the synchronization edge.

In one or more embodiments, it is possible to choose a value of time shift TS comprised between AD Max and AD Min+VD Max.

In one or more embodiments, in order to prevent the pulsed signal PWM from synchronizing with the undesired rising edge of CLK_chip, it is possible to create a further delay (which may be defined as "coarse delay"), which generates a new signal PWM_RC that may be used for the purposes of synchronization with respect to CLK_chip.

Figure 8:
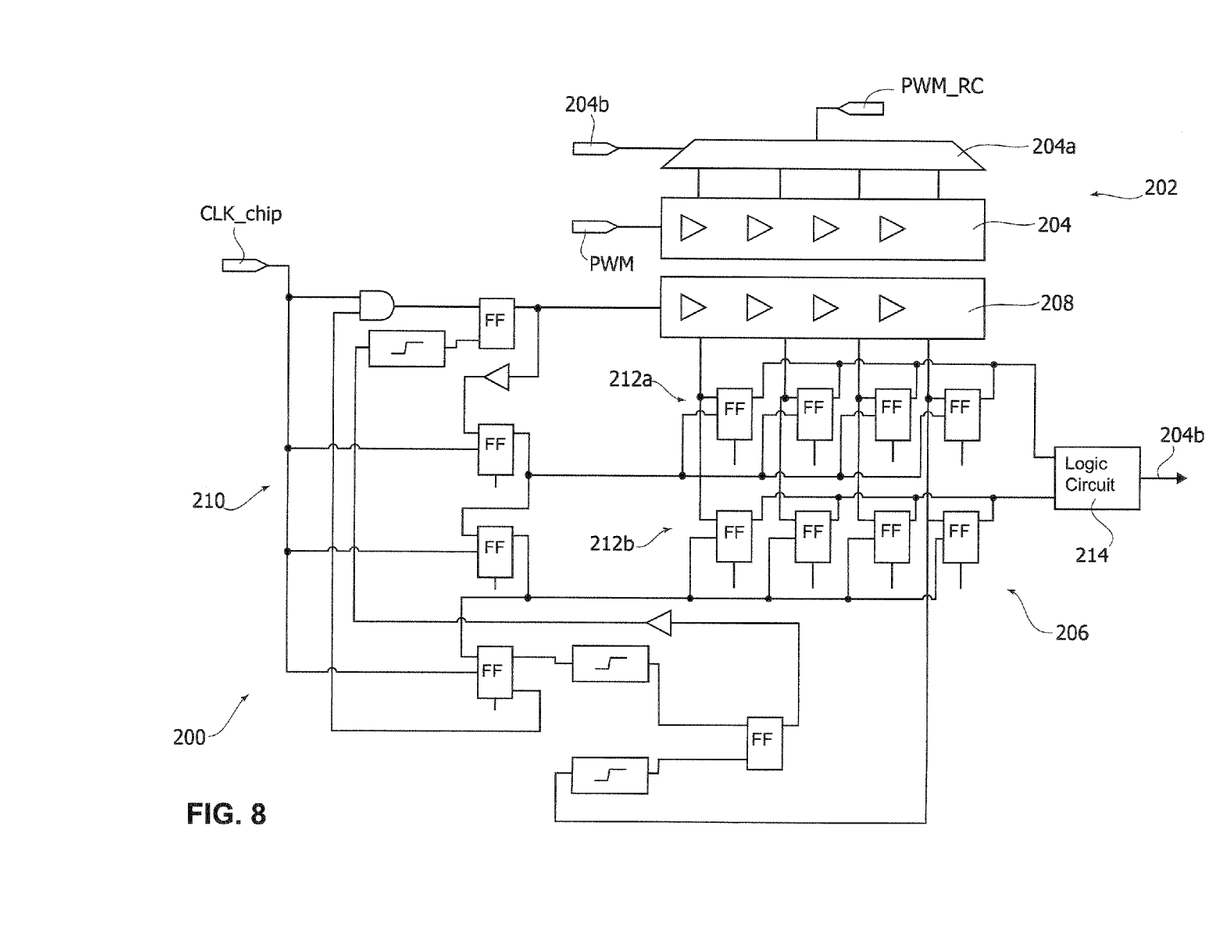
FIGS. 8, 9, and 10 are various block diagrams exemplifying embodiments.
Figure 9:
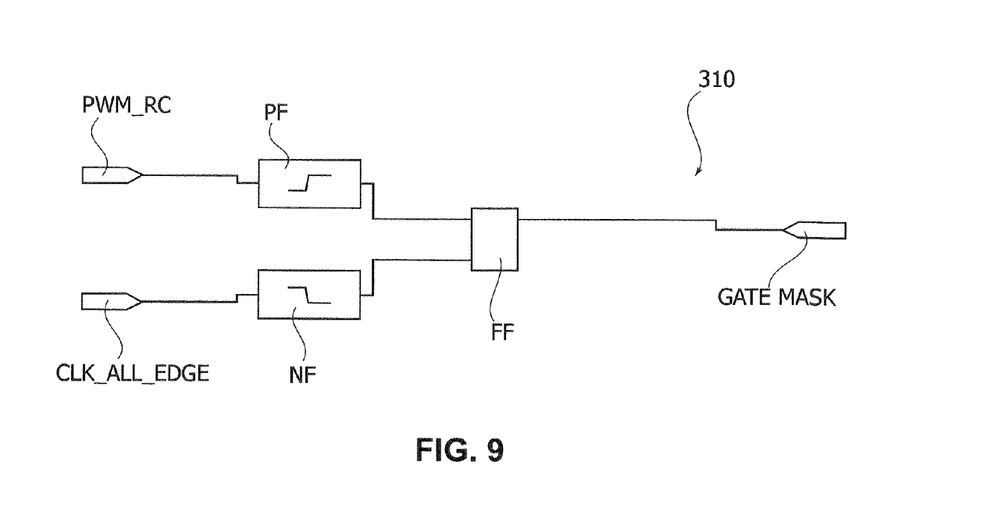
Figure 10:
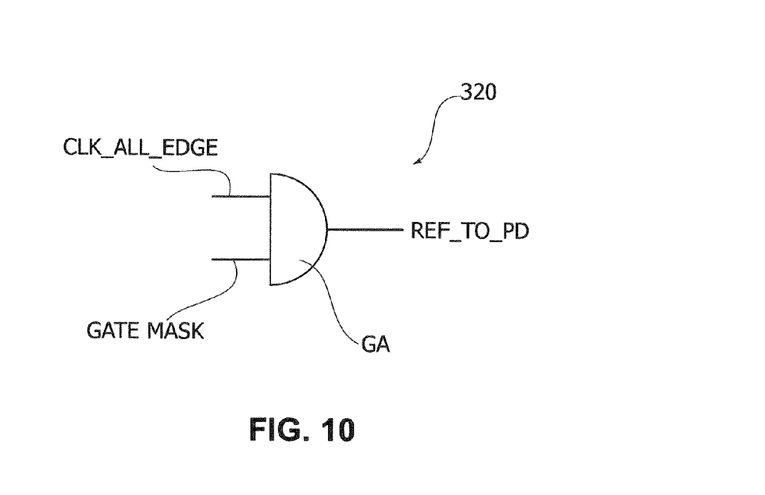

In one or more embodiments, generation of the aforesaid delay (signal PWM_RC) may be assigned to a circuit 200 that can be implemented according to the criteria exemplified in FIGS. 8, 9, and 10. These figures are to be read in a coordinated way with FIG. 4, assuming that in this case the phase comparator 116 will receive, on the one hand, the signal OUT and, on the other hand, the signal REF_TO_PD, it being once again possible to obtain that, in one or more embodiments, the circuit solution described will not depend upon the clock frequency and hence upon the resolution of the signal PWM.

One or more embodiments may take into account the fact that also the delay used for creating the signal PWM_RC may in turn be affected by the PVT factors, with the risk of sending the edge of the new signal out of the interval established for effective synchronization.

In order to overcome this possible problem, in one or more embodiments it is possible to resort to an implementation of the circuit 200 as exemplified in FIG. 8 by providing a delaying block, which may be viewed as a block compensated with respect to the PVT factors.

In one or more embodiments, in the circuit 200 there may be present a block 202 with the function of generating the signal PWM_RC by delaying the signal PWM selectively.

This may be obtained using, for example, a delay structure 202 substantially resembling those already represented in FIG. 4, i.e., a delay structure comprising a delay line 204 and a multiplexer 204a so as to apply a delay that varies as a function of a selection signal applied on a terminal 204b.

In one or more embodiments, the signal PWM_RC is not arranged to be sent to the delay circuit (106, 106a, 108, 108a) and may be used, for instance, according to the criteria exemplified in FIGS. 8, 9 and 10.

In one or more embodiments, a second block of the circuit 200, designated by 206, may have the function of identifying the delay to be applied via the block 202 by producing the selection signal applied on the terminal 204b for example, as a digital word that is used to govern the multiplexer 204a of the block 204.

In one or more embodiments, it may be an instantiatable module comprising a clocking circuit 210 to which the signal CLK_chip and a set of flip-flops 212a, 212b are applied.

In one or more embodiments, the number of the chains and, in addition or in the alternative, the number of flip-flops comprised in these chains may be determined as a function of the desired level of precision. The fact that FIG. 8 shows two chains of flip-flops 212a and 212b—each comprising four flip-flops—hence merely the nature of a non-limiting example.

The block 206 (which may be viewed as a calibration block) may comprise a respective delay element 208 that acts as "copy" of the block 204 in the sense that the buffers used for generating the delayed signal PWM_RC in the block 204 can be calibrated through an identical copy thereof present in the block 208 (hence subjected to the same PVT variations) constantly measured through signals generated by the calibration clock signal.

In one or more embodiments, the above solution enables more precise calibrations by increasing the frequency of the calibration clock, which may be the system clock CLK_chip itself, it thus being possible to achieve a greater precision of calibration when advantageous.

In one or more embodiments, the calibration may be obtained through the chains of flip-flops 212a, 212b, . . . , which sample, for example, internal signals of the block 204 at different instants defined by the timing circuit 210.

It will be appreciated that, even though FIG. 8 refers (purely by way of example) to sampling at two instants (for example, $t_1$ and $t_2$), sampling may be more or less extended according to the performance required.

In one or more embodiments, the sampled values of the chains of flip-flops 212a, 212b, . . . may be processed by a logic circuit 214, which enables, so to speak, evaluation of the degree of variation of the nominal delay of the individual buffers present in the block 208 and consequently in the block 204, due to the PVT factors, for example by comparing the signals sampled with a preloaded look-up table (LUT) taking into account the integrals of the delays in typical operating conditions, i.e., in the absence of PVT variations.

In one or more embodiments, as a function of the delay introduced by the individual delay units of these blocks, it is possible to select the correct output through the signal 204b.

For instance, if through the calibration circuit it is understood that the individual delay unit has a "weight" of 1 nanosecond (ns) and it is intended to delay the signal PWM by 6 ns, via the multiplexer 204a it is possible to select in the delay block 204—with the signal PWM at input—for example, the sixth output (five delay units by 6 ns in sequence).

Once again by way of example, if through the calibration circuit it is understood that the individual delay unit had varied by 20% passing to 1.2 ns, it will be possible to operate via the multiplexer 204a so as to select the fifth output of the block 204 in order to delay the signal PWM once again by the same value of 6 ns.

In one or more embodiments, the logic block 214 hence enables determination of the value of the selection signal for the multiplexer 204a of the block 204.

Exemplified in FIGS. 9 and 10 are possible criteria of implementation of circuits 330, 310, and 320 for generating the masking signal GATE_MASK for identification of the edge of the signal CLK_ALL_EDGE and for generating the reference for the synchronization REF_TO_PD.

As may be appreciated, for example, from the possible time plot exemplified in FIG. 3, in one or more embodiments the signal CLK_ALL_EDGE may be generated by an edge detector 330 that can detect the edges (both positive and negative ones) of the clock CLK_chip.

In one or more embodiments, the circuit 310 of FIG. 9, which receives at input the signal PWM_RC from the block 200 and the signal CLK_ALL_EDGE from the edge detector 330 may comprise, for example, a flip-flop FF and may use:
  as set signal for the flip-flop FF, the output of an positive-edge detection circuit PF having as input the signal PWM_RC; and
  as reset signal for the flip-flop FF, the output of a negative-edge detection circuit NF having as input the signal CLK_ALL_EDGE.

In one or more embodiments, the output Q of the flip-flop FF may thus supply the signal GATE_MASK (see once again FIG. 3 for an example of possible timeplot).

In one or more embodiments, the circuit 320 of FIG. 10 may simply comprise a logic gate GA such as an AND gate that generates the signal REF_TO_PD, starting from the signals CLK_ALL_EDGE and GATE_MASK In one or more embodiments, in conditions as the ones represented in FIGS. 6 and 7, i.e., when the digital delay VD2, VD3 together with the analog delay AD2, AD3 is unable to obtain the time shift TS (here considered as fixed reference or target datum), the solution just exemplified enables application to the sync signal of a coarse delay starting from an even more delayed sync signal PWM_RC.

In one or more embodiments, calibration of the delay in regard to the PVT variations may be obtained by envisaging that each module has an output signal sampled (at least) twice by internal signals.

In one or more embodiments, it is possible, for example, to envisage generation of two different digital thermometric "worlds", for example, with two digital words that contain information on the PVT variations.

In one or more embodiments, this information on the PVT variations may be correlated with the clock frequency of the system, which may prove meaningful for the purposes of determination of the delay.

In this way, in one or more embodiments, it is possible to simplify the calibration circuit and increase the flexibility of the delay block.

In one or more embodiments, it is possible to reduce the complexity and take into account the process variations by calibrating the block during the final test. In this case, the information regarding the process variations can be written in the one-time-programmable (OTP) memory, whereas in the operating mode it is possible to carry out calibration of temperature and voltage.

Without prejudice to the underlying principles, the details of construction and the embodiments may vary, even significantly, with respect to what has been illustrated herein purely by way of non-limiting example, without thereby departing from the sphere of protection.

The above sphere of protection is defined by the annexed claims.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A synchronization method to synchronize a circuit with a synchronization signal, comprising:
   operating the circuit, said circuit exhibiting a time spread delay associated with a process, voltage, temperature (PVT) variation;
   applying a digital delay to the synchronization signal, the digital delay formed as an amount time up to said time spread delay;
   detecting a time offset between a signal output from said circuit and a timing signal;
   generating said digital delay with at least one set of cascaded delay elements, each cascaded delay element of the at least one set of cascaded delay elements having a respective delay value; and
   controlling said digital delay by selecting one or more of the cascaded delay elements included in said at least one set of cascaded delay elements, wherein controlling said digital delay includes selecting the at least one of the cascaded delay elements as a function of said detected time offset.

2. The synchronization method of claim 1, wherein said selecting the at least one of the cascaded delay elements as a function of said detected time offset comprises:
   obtaining a target time shift between said synchronization signal and said timing signal.

3. The synchronization method of claim 2, comprising:
   when a sum of said digital delay and said time spread delay is less than said target time shift:
   applying to said synchronization signal a further delay by generating a delayed synchronization signal, and
   obtaining said target time shift between said delayed synchronization signal and a subsequent edge of said timing signal.

4. The synchronization method of claim 3, comprising:
   detecting changes induced by said PVT variation in the time spread delay applied to said delayed synchronization signal, and
   countering effects induced by said PVT variation in the time spread delay applied to said delayed synchronization signal using at least one second set of cascaded delay elements.

5. A device to synchronize operation of a circuit block exhibiting a time spread delay associated with a process, voltage, temperature (PVT) variation, comprising:
   an input terminal to receive a synchronization signal, the synchronization signal having positive and negative edges;
   an edge detection circuit to detect the positive and negative edges of said synchronization signal and to generate at least one pulsed signal, pulses of said at least one pulsed signal being indicative of the positive and negative edges of said synchronization signal;

at least one delay circuit having at least one set of cascaded delay elements to produce a delayed version of said at least one pulsed signal for application to said synchronization signal, wherein the circuit block is arranged to receive said delayed version of said at least one pulsed signal;

a selection circuit to select one or more cascaded delay elements of the at least one set of cascaded delay elements included in said at least one delay circuit;

a phase detector to detect a time offset between an output signal of said circuit block and a timing signal; and a control circuit to provide input to said selection circuit, the input provided as a function of said time offset, the input determining how many cascaded delay elements of the at least one set of cascaded delay elements are included in said at least one delay circuit.

6. The device of claim 5, wherein the at least one pulsed signal generated by said edge detection circuit includes a first pulsed signal and a second pulsed signal, pulses of said first pulsed signal and said second pulsed signal being indicative of the positive and negative edges of said synchronization signal, the device comprising:

a first delay circuit for delaying said first pulsed signal;
a second delay circuit for delaying said second pulsed signal;
a flip-flop circuit having a set input, a reset input, and an output, said set input configured to receive said delayed first pulsed signal, said reset input configured to receive said delayed second pulsed signal, and said output configured to provide said delayed version of said at least one pulsed signal.

7. The device of claim 5, said circuit block comprising:
a low-to-high voltage level shifter to act on said delayed version of said at least one pulsed signal; and
a high-to-low voltage level shifter to obtain said output signal, said output signal exhibiting, with respect to said delayed version of said at least one pulse signal, a delay subject to time spread.

8. The device of claim 5, comprising:
a delay circuit to generate a delayed synchronization signal, wherein said timing signal is derived from said delayed synchronization signal.

9. The device of claim 8, comprising:
a calibration circuit sensitive to changes induced by said PVT variation in a delay applied by said delay circuit, said calibration circuit configured to counter effects induced by said PVT variation in the delay applied by said delay circuit to said delayed synchronization signal.

10. An integrated circuit, comprising:
a first circuit to be synchronized with a variable-delay synchronization signal, said first circuit exhibiting a time spread delay associated with a process, voltage, temperature (PVT) variation; and
a second circuit to produce the variable-delay synchronization signal, said second circuit including:

an input to accept a synchronization signal;
at least one set of cascaded delay elements, each cascaded delay element of the at least one set of cascaded delay elements having a respective delay value;
a phase detector to detect a time offset between an output signal of said first circuit and a timing signal;
a selection circuit configured to control a digital delay by selecting one or more of the cascaded delay elements for inclusion in said at least one set of cascaded delay elements;
an application circuit configured to produce the variable-delay synchronization signal by applying the digital delay to the synchronization signal, the digital delay formed as an amount time up to said time spread delay; and
a control circuit coupled to the phase detector, said control circuit configured to provide input to said selection circuit, the input to said selection circuit provided as a function of said time offset, the input determining how many cascaded delay elements of the at least one set of cascaded delay elements are included in said at least one delay circuit.

11. The integration circuit of claim 10, the second circuit comprising:
an edge detection circuit to detect rising and falling edges of said synchronization signal and to generate at least one pulsed signal having pulses responsive to the rising and falling edges of said synchronization signal, an output of said edge detection circuit coupled to an input of said at least one set of cascaded delay elements.

12. The integration circuit of claim 11, wherein said edge detection circuit is configured to generate two pulsed signals, a first one of the two pulsed signals having pulses responsive to the rising edges of said synchronization signal and a second one of the two pulsed signals having pulses responsive to falling edges of said synchronization signal.

13. The integration circuit of claim 12, wherein said at least one set of cascaded delay elements includes a first set of cascaded delay elements arranged to receive the first one of the two pulsed signals and a second set of cascaded delay elements arranged to receive the second one of the two pulsed signals.

14. The integration circuit of claim 10, the second circuit comprising:
a delay circuit to generate a delayed synchronization signal, wherein said timing signal is derived from said delayed synchronization signal.

15. The integration circuit of claim 10, comprising:
at least one digital filter coupled between the control circuit and the selection circuit.

16. The integration circuit of claim 14, comprising:
a calibration circuit sensitive to changes induced by said PVT variation in a delay applied by said delay circuit, said calibration circuit configured to counter effects induced by said PVT variation in the delay applied by said delay circuit to said delayed synchronization signal.

* * * * *